Figure 1:
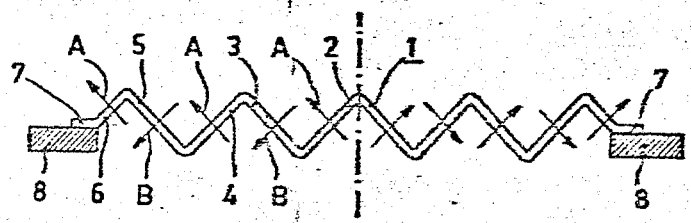

United States Patent
Franssen et al.

[11] 4,028,566
[45] June 7, 1977

[54] ELECTROACOUSTIC CONVERSION DEVICE HAVING A DIAPHRAGM COMPRISING AT LEAST ONE OF A PIEZOELECTRIC POLYMER MATERIAL

[75] Inventors: Nico Valentinus Franssen, Eindhoven; Frans Josef Maria Frankert, Bocholtz, both of Netherlands

[73] Assignee: U.S. Philips Corporation, New York, N.Y.

[22] Filed: Feb. 23, 1976

[21] Appl. No.: 660,696

[30] Foreign Application Priority Data
Mar. 3, 1975 Netherlands ............ 7502453

[52] U.S. Cl. .................. 310/9.5; 310/9.6; 29/25.35
[51] Int. Cl.² .................. H01L 41/04
[58] Field of Search ......... 310/8.5, 8.6, 9.5, 9.6, 310/8; 179/110 A, 111 E

[56] References Cited
UNITED STATES PATENTS

| | | | |
|---|---|---|---|
| 3,798,474 | 3/1974 | Cassand et al. | 310/8.6 X |
| 3,816,774 | 6/1974 | Ohnuki et al. | 310/8.6 |
| 3,832,580 | 8/1974 | Yamamuro et al. | 310/9.5 |

Primary Examiner—Mark O. Budd
Attorney, Agent, or Firm—Frank R. Trifari; Bernard Franzblau

[57] ABSTRACT

A device for converting electric into acoustic vibrations and vice versa, provided with a diaphragm, comprising at least one layer of a piezoelectric polymer material, which is polarized in a transverse direction and which at either side is provided with electrodes, the diaphragm being undulated in at least one orthogonal section, whilst each flank of the undulation is polarized in the same direction over its entire width and in the operating condition the direction of the applied electric field relative to the direction of polarization in adjoining flanks are alternately parallel and anti-parallel. Two types of embodiments are possible. In the first embodiment the direction of polarization in each flank is opposed to that of at least one adjacent flank; in the second embodiment all flanks are polarized in the same direction, each flank being provided with a pair of electrodes which are oppositely disposed relative to each other, which pair is electrically isolated from a corresponding electrode pair of at least one adjacent flank, which last-mentioned pair in the operating condition has an opposite polarity relative to the first-mentioned electrode pair.

The use of polyvinylidenefluoride as a piezoelectric material has been found to be very favorable.

10 Claims, 6 Drawing Figures

ELECTROACOUSTIC CONVERSION DEVICE HAVING A DIAPHRAGM COMPRISING AT LEAST ONE OF A PIEZOELECTRIC POLYMER MATERIAL

The invention relates to a device for converting electric into acoustic vibrations and vice versa, said device comprising a diaphragm including at least one layer of a piezoelectric polymer material which is polarized in a transverse direction and which at either side is provided with electrodes, the diaphragm being undulated in at least one orthogonal section.

Such a device is known from U.S. Pat. No. 3,816,774. This Patent describes a number of undulating loudspeaker diaphragms which generally consist of a bi-laminar assembly of piezoelectric layers.

Upon application of an audio-frequency alternating voltage, deflection effects will occur in these diaphragms so that the diaphragm moves in a transverse direction and consequently acts as a loudspeaker.

In one of these embodiments the surfaces of the consecutive undulations are alternately polarized oppositely.

The invention is characterized in that each flank of the undulation is polarized in the same direction over its entire width, while in the operating condition the direction of the applied electric field is alternately in parallel and in anti-parallel relative to the polarizing directions in adjacent flanks.

In contradistinction to said known embodiment, the directions of both the applied electric field and the polarizing field remain the same over the entire flank from crest to crest. Owing to this, the application of a voltage in the operating condition will not give rise to deflection, but will merely cause contraction or elongation in the relevant flank so that the diaphragm obtains a transverse movement.

A series of embodiments according to the invention is characterized in that the direction of polarization in each flank is opposite to that of at least one adjacent flank. In this embodiment only two electrodes are provided which are disposed opposite each other and which cover the entire area of the undulated diaphragm.

The orthogonal section of each undulation may take the form of a V with flat flanks, or of a trapezium.

The grooves thus obtained may be parallel, circular or elliptical.

Polyvinylidenefluoride is highly suitable as a piezoelectric material.

When this material is used in a single layer, a diaphragm with V-shaped parallel grooves can be polarized very simply. A single foil is then used as the basic material, which is each time folded oppositely at flank-width, so that a stack is obtained which is inserted between the electrodes of a polarizing device. After polarization the foil, which is now piezoelectric, is unfolded to the desired length.

In a different suitably operating embodiment of the invention all flanks are polarized in the same direction, each flank being provided with a pair of oppositely disposed electrodes which are electrically isolated from a corresponding electrode pair of at least one adjoining flank, said last-mentioned electrode pair having an opposite polarity relative to the first-mentioned electrode pair in the operating condition.

This yields the advantage that by parallel or series connection of the electrode pairs an optimum adaptation to the relevant amplifier can be achieved.

Figure 2:
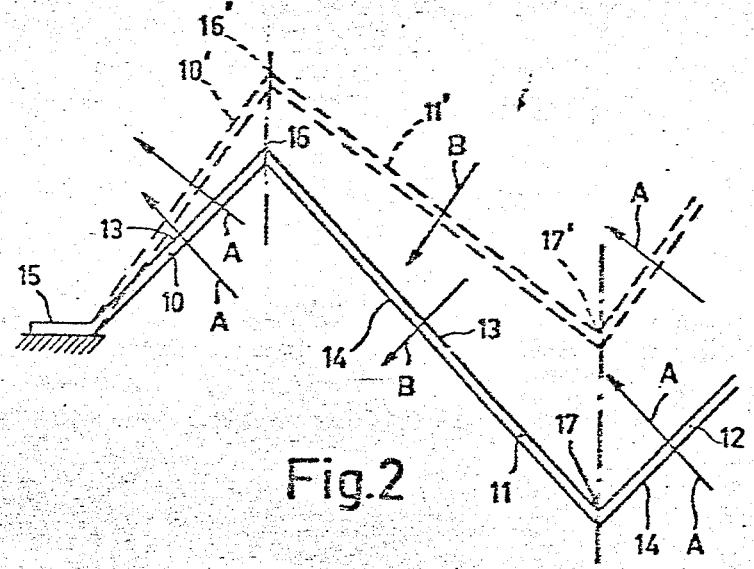
Figure 3:
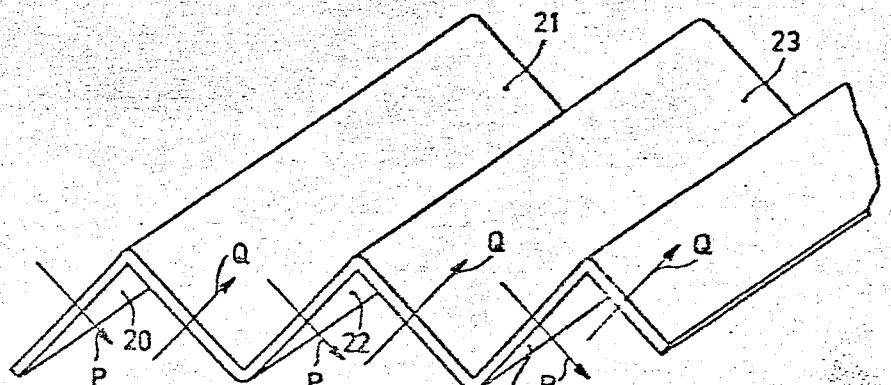
Figure 4:
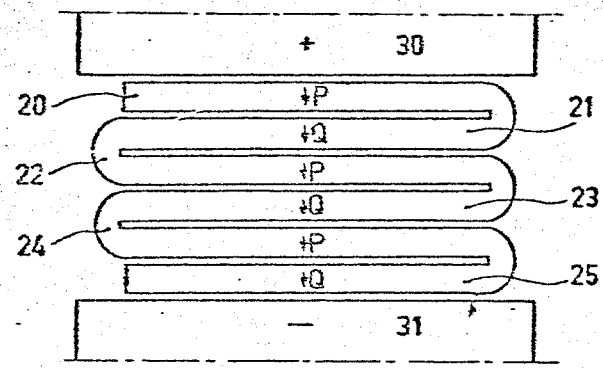
Figure 5:
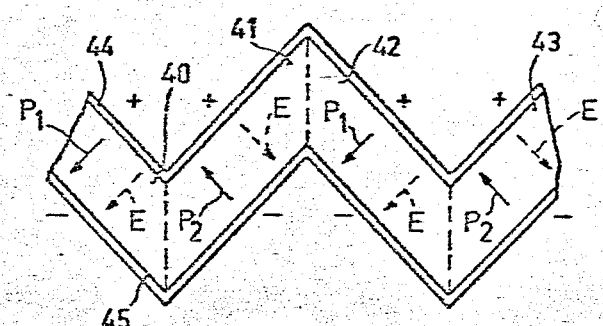
Figure 6:
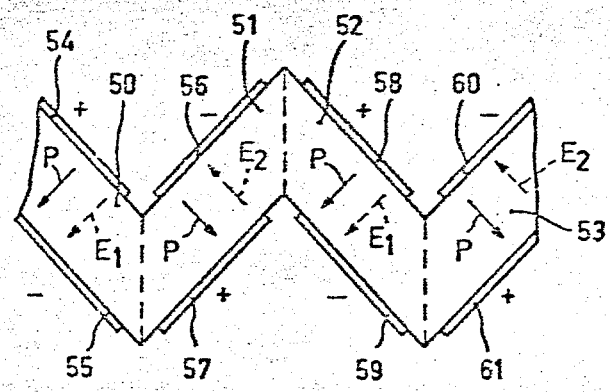

The invention will be described in more detail with reference to the accompanying drawing in which:

FIG. 1 shows a diaphragm with three V-shaped grooves according to the invention;
FIG. 2 shows a detail of FIG. 1;
FIG. 3 shows an unfolded rectangular diaphragm;
FIG. 4 shows a polarizing device with a folded diaphragm in accordance with FIG. 3; and
FIGS. 5 and 6 show a detail of FIG. 1.

FIG. 1 shows a loudspeaker diaphragm which consists of a foil of polyvinylidenefluoride, which material has piezo-electric properties. This foil is at either side provided with vacuum-deposited metal electrodes (not shown).

The diaphragm 1 is circular and is divided into flanks 2 through 6 by means of circular grooves - V-shaped in cross-section - which flanks are straight in cross-section.

The outermost flank 6 is provided with a flat rim 7, which is fixed to a frame 8 which is shown schematically. The diaphragm 1 is polarized in a transverse direction, i.e. perpendicularly to the foil flank and each flank oppositely to its adjacent flank. The flanks 2, 4 and 6 are polarized in the same directions and perpendicularly to the edge in accordance with arrow A, whereas the flanks 3 and 5 are polarized in an opposite direction in accordance with arrow B.

When the electrodes are connected to an A.F. alternating voltage, the flanks of the diaphragm are subject to length variations so that the diaphragm will move in a transverse direction and starts to behave as a loudspeaker.

The operation will be further explained with reference to FIG. 2 which shows a detail of the diaphragm of FIG. 1. Flank 10 is polarized in the direction A and flank 12 is polarized in accordance with flank 10 in the direction A. The upper surface of the diaphragm is provided with an electrode 13 and the lower surface with an electrode 14.

When the two electrodes are connected to a direct voltage, the following will happen. The flanks 10, 11 and 12 will expand or contract depending on the direction of polarization and the applied direct voltage. Assuming that flank 10 is elongated, flank 11 will contract and the following flank 12 will be elongated again. Flank 10 thus becomes longer and assumes the dashed position 10'. Furthermore, it is assumed that flank 10 is the first flank of the diaphragm and is fixed at one side at the location 15. The flank 10 will pivot about said point of attachment 15. The intersection 16 (=line of intersection) between flanks 10 and 11 moves upwards and reaches the position 16', which will be situated approximately above the point 16 because the length of the elongated flank 10' is greater than that of the flank 10.

Flank 11 shortens and assumes the position 11'. The intersection 17 (=line of intersection) between the flanks 11 and 12 moves upwards to point 17'. The distance between these points 17 and 17' is thus obtained owing to the movement of flank 10 as well as flank 11.

When the polarity of the applied direct voltage is reversed, the flanks will move in an opposite direction - downwards in FIG. 2 - and the points 16' and 17' will be situated below the corresponding reference points 16 and 17.

A diaphragm with V-shaped grooves, which are parallel to each other so that elongated rectangular flanks are obtained, can be polarized in a very simple manner. Such a diaphragm is shown in FIG. 3, the flanks 20, 22 and 24 being polarized in the direction of the arrow P and the flanks 21 and 23 in the direction of the arrow Q.

This diaphragm is manufactured from a foil of a piezo-electric polymer material which is folded at flank width and each time in an opposite direction. Thus, a stack is obtained, the flanks 20 through 25 being arranged on top of each other in this order.

This stack is inserted between the electrodes 30 and 31 of a polarizing device in accordance with FIG. 4, after which the required polarizing voltage is applied.

After this process the folded diaphragm is unfolded to the desired width.

The detail of FIG. 2 is once more shown in FIG. 5. The thickness of its flank relative to the width is greatly exaggerated in this Figure. The flanks 40, 41, 42 and 43 are each time oppositely polarized; flanks 40 and 42 in accordance with the direction of arrow $P_1$ and flanks 41 and 43 in accordance with the direction of arrow $P_2$. The electrodes 44 and 45 are disposed opposite to each other. They each cover all flanks. At a specific instant electrode 44 will have a positive voltage and electrode 45 a negative voltage, so that between the electrodes 44 and 45 an electric field E is produced whose direction is denoted by a dashed arrow.

It can be seen clearly that the directions of the polarizations $P_1$ and $P_2$ respectively and the applied electric field E in the flanks are alternately in parallel and in anti-parallel relative to each other. This means parallel in the flanks 40 and 42 and in anti-parallel in the flanks 41 and 43.

When the polarity of the applied voltage is reversed, i.e. when the voltage of electrode 44 becomes negative and that of the electrode 45 positive, the direction of the applied electric field will be opposite to that shown so that the polarizing direction and the direction of the applied electric field in the flanks 40 and 42 will be anti-parallel.

FIG. 6 shows a different embodiment of the diaphragm of FIG. 1. The electrodes on each flank are now electrically isolated from the electrodes of the adjacent flank.

In all the flanks 50, 51, 52 and 53 the polarization has the direction of the arrow P.

Flank 50 is provided with a pair of electrodes 54 and 55; flank 51 with a pair of electrodes 56 and 57; flank 52 with a pair of electrodes 58 and 59, and flank 53 with a pair of electrodes 60 and 61.

The electrode pairs are always connected in sequence to an opposite voltage. In consecutive flanks the electric field always has an opposite direction. This means that in the flanks 50 and 52 the electric field is in accordance with the dashed arrow $E_1$ and in the flanks 51 and 53 in accordance with arrow $E_2$, which arrows have opposite directions. FIG. 6 clearly shows again that the directions of polarization P and those of the applied electric field $E_1$ and $E_2$ respectively are alternately parallel and anti-parallel, i.e. in the flanks 50 and 52 they are parallel and in the flanks 51 and 53 anti-parallel. When the polarity of the applied voltage is changed, these directions will be reversed.

What is claimed is:

1. A device for converting an electric voltage into acoustic vibrations and vice versa comprising, a diaphragm including at least one layer of a piezo-electric polymer material which is polarized in a transverse direction and which at either side is provided with electrodes, the diaphragm being undulated in at least one orthogonal section, characterized in that each flank of the undulation is polarized in the same direction over its entire width, and in the operating condition the direction of the applied electric field is alternately parallel and anti-parallel relative to the polarizing directions in adjacent flanks.

2. A device as claimed in claim 1, characterized in that the polarizing direction in each flank is opposite to that of at least one adjacent flank.

3. A device as claimed in claim 2, characterized in that each half undulation is V-shaped with flat flanks.

4. A device as claimed in claim 3, characterized in that each half undulation takes the form of a trapezium.

5. A device as claimed in claim 1, characterized in that all flanks are polarized in the same direction, each flank being provided with a pair of oppositely disposed electrodes electrically isolated from a corresponding electrode pair of at least one adjoining flank, said last-mentioned electrode pair having an opposite voltage polarity in the operating condition relative to the first-mentioned electrode pair.

6. A device as claimed in claim 1 wherein the piezo-electric material comprises polyvinylidene-fluoride.

7. A method of manufacturing a device as claimed in claim 3 comprising, taking a sheet of a polymer material and alternately folding it in opposite directions into a stack composed of a desired number of strips, which strips are arranged on top of each other, and polarizing the polymer material of the stack perpendicularly to the direction of folding by means of a DC field and before the application of the electrodes.

8. A method of fabricating an undulating electroacoustic diaphragm having V-shaped parallel grooves and flat flanks comprising, folding a single rectangular sheet of a polymer material at flank-width alternately in opposite directions to form a stack of strips arranged on top of each other, and applying a DC electric field to said stack in a direction orthogonal to the strips so as to polarize the polymer material perpendicular to the wide surfaces of the strips.

9. The method as claimed in claim 8 comprising the further step of applying electrodes to the opposite surfaces of the diaphragm strips subsequent to the polarizing step.

10. The method as claimed in claim 8 comprising the further step of unfolding the stack to the desired length of the diaphragm.

* * * * *

UNITED STATES PATENT AND TRADEMARK OFFICE
CERTIFICATE OF CORRECTION

PATENT NO. : 4,028,566
DATED : June 7, 1977
INVENTOR(S) : NICO VALENTINUS FRANSSEN ET AL It is certified that error appears in the above-identified patent and that said Letters Patent are hereby corrected as shown below:

Col. 2, line 13, after "diaphragm" there should be --1--;

Col. 3, line 21, "its" should be --the--, and before "width" "the" should be --its--;

IN THE CLAIMS

Claim 7, line 3, "materialand" should be --material and--;

IN THE TITLE

Line 3 of the title, after "ONE" there should be inserted --LAYER--.

Signed and Sealed this

Twenty-fifth Day of October 1977

[SEAL]

Attest:

RUTH C. MASON
Attesting Officer

LUTRELLE F. PARKER
Acting Commissioner of Patents and Trademarks